United States Patent [19]
McPherson

[11] Patent Number: 4,571,663
[45] Date of Patent: Feb. 18, 1986

[54] ELECTRICAL CIRCUIT ASSEMBLIES

[75] Inventor: Hugh McPherson, West Linton, Scotland

[73] Assignee: Ferranti plc, Cheshire, England

[21] Appl. No.: 503,604

[22] Filed: Jun. 13, 1983

[30] Foreign Application Priority Data

Jun. 19, 1982 [GB] United Kingdom ............... 8217816

[51] Int. Cl.[4] .............................................. H05K 7/14
[52] U.S. Cl. .................................... 361/393; 361/412; 361/415
[58] Field of Search ........................... 174/51; 211/41; 339/14 L, 14 P, 14 R, 14 RP, 17 M, 17 LM, 17 N, 143; 361/393, 394, 396, 398, 412, 413, 415, 406, 407

[56] References Cited

U.S. PATENT DOCUMENTS

| | | | |
|---|---|---|---|
| 2,797,397 | 6/1957 | MacFadden | 339/14 T |
| 2,931,003 | 3/1960 | Huetten et al. | 361/412 |
| 3,197,766 | 7/1965 | Stein et al. | 361/412 |
| 3,221,286 | 11/1965 | Fedde | 361/412 |
| 3,258,650 | 6/1966 | Fiege | 361/415 |
| 3,462,649 | 8/1969 | Stich | 361/415 |
| 3,492,538 | 1/1970 | Fergusson | 361/412 |
| 3,806,767 | 4/1974 | Lehrfeld | 361/412 |
| 3,852,690 | 12/1974 | Telfer | 339/17 N |
| 3,871,728 | 3/1975 | Goudman | 339/14 R |
| 3,939,444 | 2/1976 | Hollyday et al. | 174/51 |
| 3,992,686 | 11/1976 | Canning | 361/413 |
| 4,237,546 | 12/1980 | Wells | 361/413 |
| 4,243,283 | 1/1981 | McSparran | 339/14 R |

FOREIGN PATENT DOCUMENTS

| | | | |
|---|---|---|---|
| 1478507 | 4/1967 | France | 361/412 |
| 0403896 | 5/1966 | Switzerland | 361/412 |
| 0422937 | 4/1967 | Switzerland | 361/415 |
| 1326972 | 8/1973 | United Kingdom | |

OTHER PUBLICATIONS

Comerford, IBM Technical Disclosure Bulletin, "Flip Chip Bonded Ground Plane for Ceramic Chip Carriers", vol. 24, No. 4, 9/81, pp. 1978–1979.

Primary Examiner—A. D. Pellinen
Assistant Examiner—Gregory D. Thompson
Attorney, Agent, or Firm—Kerkam, Stowell, Kondracki & Clarke

[57] ABSTRACT

An electrical circuit assembly comprises a stack of a plurality of substantially identically constructed modules, each module includes a planar, electrically insulating substrate having constituent elements of a circuit on only one major surface of the substrate, and has an electrically conductive coating on the other major substrate surface. The assembly has at least one conductor member, at least partially, holding the modules in their required locations in the stack, each conductor member and the conductive coatings being interconnected, and together forming an extensive body, to be maintained at zero potential, to reduce electrical interaction between the circuit elements. Each conductor member may be planar in shape, or may comprise a corner piece for the stack. A plurality of stacks on a common support may have a common module, and/or share a common conductor member, and the support may provide a conductor member.

10 Claims, 5 Drawing Figures

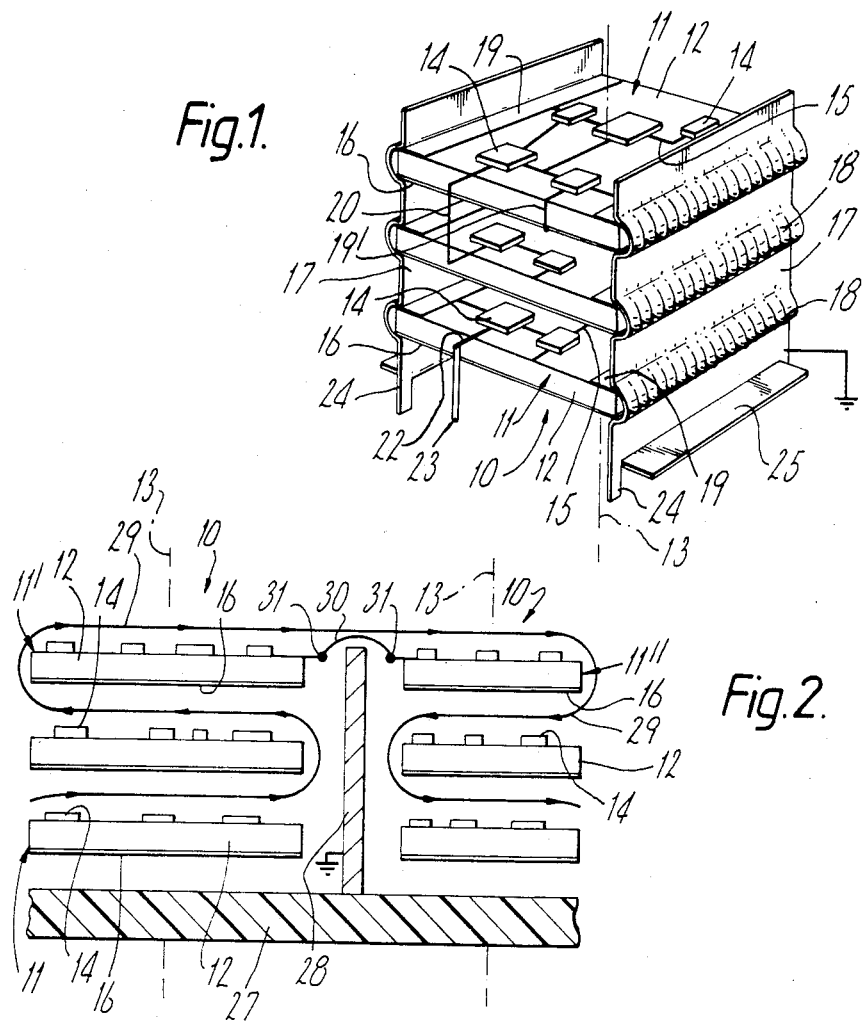
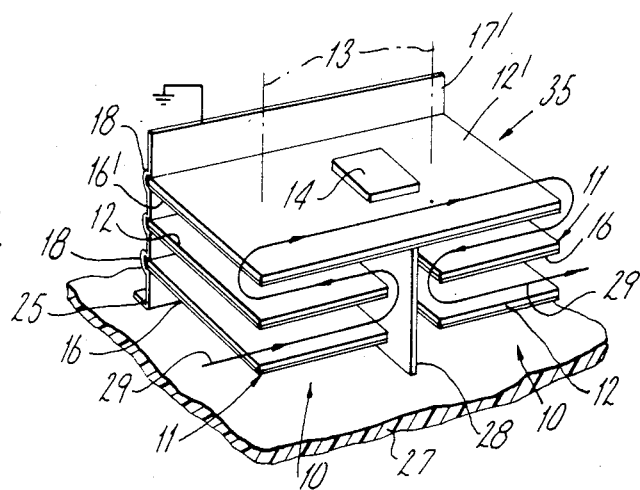

ELECTRICAL CIRCUIT ASSEMBLIES

BACKGROUND OF THE INVENTION

This invention relates to electrical circuit assemblies, and in particular to electrical circuit assemblies each having a plurality of at least substantially identically constructed modules in the form of a stack, each such module including an, at least substantially, planar, electrically insulating, substrate, extending at right angles to the longitudinal axis of symmetry of the stack, the assembly having circuit elements mounted on each substrate, and electrical interconnections are provided between the constituent modules of the stack to complete a required circuit. The circuit elements on any substrate may include conductors interconnecting circuit elements comprising components, such as packaged, or unencapsulated, semiconductor devices, also provided on the substrates.

The constituent modules may be secured, in their desired locations within the stack, in any convenient way. Usually, a plurality of members are provided, extending parallel to the longitudinal axis of symmetry of the stack, and, at least partially, holding the modules in their required locations within the stack, each substrate co-operating with the members in any convenient way. Additional securing means, of any convenient form, may be provided for the stack. In any such arrangement, the provision of the members is advantageous, the members being capable of readily holding the modules in their required locations in the stack, during the assembling of the stack.

Further, the electrical interconnections provided between the modules may have any convenient form, and may comprise some of the members, at least partially, holding the modules in their required locations in the stack. Hence, the electrical interconnections may comprise part of the means securing the modules in the stack.

Terminals may be provided for the electrical circuit assembly in any convenient way, and may comprise constituent circuit elements on one major surface of at least one substrate, and/or end portions of electrical interconnections provided between the modules, and comprising members, at least partially, holding the modules in their required locations in the stack.

SUMMARY OF THE INVENTION

It is an object of the present invention to provide an electrical circuit assembly, comprising a stack of at least substantially identically constructed modules, each sucn module including an, at least substantially, planar, electrically insulating substrate, extending at right angles to the longitudinal axis of symmetry of the stack, the assembly having circuit elements mounted on each substrate, and with electrical interconnections provided between the constituent modules to complete a required circuit, the assembly being provided with an extensive conductive body, in the operation of the circuit, the extensive conductive body to be maintained at zero potential, to reduce undesired electrical interaction between the constituent circuit elements within the electrical circuit assembly, for example, the circuit comprising a linear circuit to operate at high frequencies.

According to the present invention an electrical circuit assembly comprises a stack of a plurality of at least substantially identically constructed modules, each such module including an, at least substantially, planar, electrically insulating substrate, extending at right angles to the longitudinal axis of symmetry of the stack, the assembly having constituent elements of a circuit therein, the circuit being completed by electrical inter-connections between the modules, and terminals are provided for the electrical circuit assembly, the constituent modules, at least partially, being held in their required locations in the stack by a plurality of members extending parallel to the longitudinal axis of symmetry of, and at least wholly along, the stack, and each of a plurality of the modules, with circuit elements on only one major substrate surface thereof, is provided with a layer of electrically conductive material coating the other major substrate surface, and at least one of said members, at least partially, holding the modules in their required locations in the stack, also comprises, or includes, a conductor member, arranged to inter-connect the electrically conductive coatings on said other major substrate surfaces, the coatings and each conductor member connected thereto, together, forming an extensive body, in the operation of the circuit, to be maintained at zero potential.

Such an electrical circuit assembly is compact and robust; and the extensive conductive body maintained at zero potential is advantageous, when the circuit provided within the assembly, is, for example, a linear circuit to operate at high frequencies, by reducing undesired electrical interaction between the constituent circuit elements.

Usually the substrates of the stack are identical.

Conveniently, the extensive conductive body is wholly metallic.

Each electrically conductive coating may be deposited, in any convenient manner, on a major substrate surface, for example, by employing known chemical vapour deposition techniques.

Any conductors, or terminals, comprising circuit elements provided within the modules, may be formed by employing known thick film techniques.

The components, such as semiconductor devices, provided within the modules, may have any form, and may be mounted on the substrates in any known way.

The extensive body provided by the electrically conductive coatings on major substrate surfaces, and the conductor members, may be connected to a point external of the electrical circuit assembly, and maintained at zero potential, in any known manner.

It may not be essential that all the modules of the electrical circuit assembly are provided with electrically conductive coatings; and circuit elements may be provided on both major substrate surfaces of such modules.

Each module substrate may co-operate with each conductor member in any convenient way, so that the electrically conductive coatings on the substrates are interconnected, and the modules, at least partially, are held in their required locations within the stack.

In one arrangement, portions of each conductor member are channel shaped in cross section, the channel shaped portions extending in a plane at right angles to the longitudinal axis of symmetry of the stack, with each substrate being a press fit into a co-operating channel shaped portion provided by each conductor member, at least partially, thereby each such conductor member interconnects the electrically conductive coatings on the substrates; the substrate, possibly, also being soldered to each such conductor member.

In another arrangement, flanges are provided by the conductor members, the flanges extending at right angles to the longitudinal axis of symmetry of the stack, each substrate being a press fit between a co-operating pair of flanges provided by each conductor member, the substrate, possibly, also being soldered to the flanges, whereby the conductor members are arranged to interconnect, through the flanges, the electrically conductive coatings on the substrate, at least one flange of each co-operating pair of flanges being electrically conductive.

At least one of each co-operating pair of flanges may be resilient.

Whether flanges are provided, or not, the module substrates may be held resiliently within the stack, at least during the assembling of the modules within the stack, and the modules may be readily replaceable.

Conveniently, each conductor member is formed from initially-planar, sheet material, by deforming the sheet material in the appropriate way, for example, by pressing.

Alternatively, each conductor member comprises an electrically conductive layer on an electrically insulating support therefor.

The module substrates each may be square shaped, or rectangular shaped, in plan, and the stack is, respectively, square shaped, or rectangular shaped, in cross-section. Each of, at least some of, the plurality of members, at least partially, holding the modules in their required locations in the stack, and also comprising, or including, each provided conductor member, may be substantially planar in form; and such conductor members may extend adjacent to two opposing sides of the stack, and the electrical interconnections are provided between the modules adjacent to the other two opposing sides of the stack, to extend parallel to the longitudinal axis of symmetry of the stack, irrespective of whether the electrical interconnections also comprise, or are included in, members, at least partially, holding the modules in their required locations in the stack, or not. Alternatively, at least some of, the pluarlity of members, at least partially, holding the modules in their required locations in the stack, and also comprising all, or including some of, the conductor members, each may comprise a corner piece for the, square shaped, or rectangular shaped, in cross section, stack.

The electrical interconnections between the modules are provided adjacent to portions of the side, or sides, of the stack extending parallel to the longitudinal axis of symmetry of the stack, such portions not being occupied by, at least, the conductor members. As indicated above, at least some of, the electrical interconnections may comprise members, at least partially, holding the modules in their required locations within the stack, and end portions thereof may comprise terminals of the electrical circuit assembly. Alternatively, or in addition, at least some of, the electrical interconnections are provided by, and comprise parts of, members, at least partially, holding the modules in their required locations within the stack, and not comprising conductor members of the extensive body to be maintained at zero potential, and each such member includes an electrically insulating support for the associated electrical interconnection.

An electrical circuit assembly in accordance with the present invention may comprise a less complex electrical circuit assembly, terminals of the less complex electrical circuit assembly being connected to other constituent parts of a more complex electrical circuit assembly, the other parts of the more complex electrical circuit assembly each having any required form. For example, the less complex electrical circuit assembly may be arranged to co-operate with a printed circuit board, the less complex electrical circuit assembly being supported by, and, at least, the conductor members, and possibly terminals, of the less complex electrical circuit assembly, being connected electrically to, the printed circuit board.

According to another aspect of the present invention a more complex electrical circuit assembly comprises the combination of at least one less complex electrical circuit assembly, each electrical circuit assembly comprising a stack of modules, of any of the forms referred to above, and within the combination said at least one electrical circuit assembly is mounted on a support, by the plurality of members, at least partially holding the modules in their required locations in the stack, co-operating with the support, the support extending at least generally in a plane at right angles to the longitudinal axis of symmetry of the stack.

At least, an adjacent pair of constituent electrical circuit assemblies, on a common support, may be arranged to share, at least, one conductor member.

Conveniently, there is provided at least an adjacent pair of constituent electrical circuit assemblies, on a common support, and an additional conductor member is provided on the common support, and extends, parallel to the longitudinal axes of symmetry of the associated stacks, between the associated adjacent pair of the electrical circuit assemblies, and the additional conductor member is connected to, and is considered to be a part of, the extensive body within each associated electrical circuit assembly, and to be maintained at zero potential, the additional conductor member reducing undesired electrical interaction between the circuit elements of the different, associated less complex electrical circuit assemblies.

At least, an adjacent pair of electrical circuit assemblies, on a common support, possibly, in addition to, sharing a conductor member, may be arranged to share a common module, at the extremities of the stacks remote from the common support, the common module having a substrate more extensive than, and extending parallel to, each other constituent substrate of each associated electrical circuit assembly, the common module being considered to be a constituent module of each associated electrical circuit assembly, and having a construction substantially identical with the other constituent modules, and may be provided with an electrically conductive coating on one major substrate surface, the electrically conductive coating co-operating with said at least one conductor member of at least one associated electrical circuit assembly. When an additional conductor member also is provided on the common support, the additional conductor member may be connected, either, to an electrically conductive coating on said other major substrate surface of the common module, and/or to a shared conductor member, if provided.

Terminals may be provided on the module substrates at the extremities of stacks remote from a common support, and such terminals of different constituent electrical circuit assemblies being connected together.

BRIEF DESCRIPTION OF THE DRAWINGS

The present invention will now be described by way of example with reference to the accompanying drawings, in which FIG. 1 comprises a perspective view of an electrical circuit assembly comprising a stack of at least substantially identically constructed modules, and, in accordance with the present invention, including conductor members, at least partially, holding the modules in their required locations in the stack, and interconnecting electrically conductive coatings provided within the modules, to form an extensive body to be maintained at zero potential, FIG. 2 is a cross sectional elevation of a combination in accordance with another aspect of the present invention, the combination being of a plurality of electrical circuit assemblies, each constituent electrical circuit assembly being the same as the electrical circuit assembly shown in FIG. 1, and is provided on a common support, in the illustrated combination the constituent electrical circuit assemblies are connected together remote from the common support, and part of the extensive body, the part being provided by the common support, extends between the electrical circuit assemblies, FIG. 3 is a perspective view of part of a modification of the combination shown in FIG. 2, FIG. 4 corresponds to FIG. 1, and is of another embodiment of such an electrical circuit assembly, and FIG. 5 also corresponds to FIG. 1, and is of yet another embodiment of such an electrical circuit assembly.

DETAILED DESCRIPTION OF THE PREFERRED EMBODIMENTS

Figure 4:
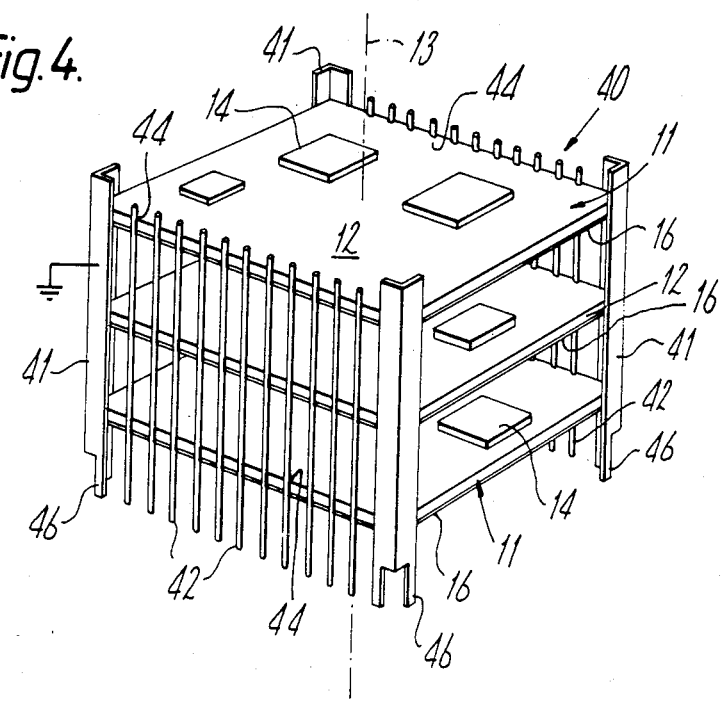

The electrical circuit assembly 10 shown in FIG. 1 comprises a stack of a plurality of at least substantially identically constructed modules 11. Each module 11 includes a planar substrate 12 of electrical insulating material, such as alumina, and is square shaped in plan. Thus, the stack is square shaped in cross section, the substrates 12 extending at right angles to the longitudinal axis of symmetry 13 of the stack 10. Circuit elements are mounted on one major surface of each substrate 12, the circuit elements including components 14, such as packaged, or unencapsulated, semiconductor devices, mounted on the substrates in any convenient manner, and connected to circuit elements in the form of conductors, some such conductors being indicated at 15. For modules 11 at either extremity of the stack, circuit elements comprising terminals (not shown), for the electrical circuit assembly, may be provided within such modules. Circuit elements provided within the modules may be formed in any convenient way, for example, conductors and terminals being provided by employing thick film techniques. Other kinds of circuit elements also may be provided in any convenient way within the modules.

The terminals for the electrical circuit assembly, and not comprising circuit elements on the substrates, may have any required construction.

Electrical interconnections, described in greater detail below, are provided between the constituent modules of the stack, to complete a required circuit.

In the stack, the constituent circuit elements of each module, except one module at one extremity of the stack, are opposite to a major surface of the substrate of an adjacent module within the stack, this adjacent, major substrate surface not bearing circuit elements.

A layer 16 of electrically conductive material is provided to coat the other major surface of each substrate. Such coatings 16 may be provided in any convenient manner, for example, by employing known chemical vapour deposition techniques.

Conductor members 17, each extending generally in a plane, at least partially, hold the modules 11 in their required locations within the stack 10, the conductor members extending parallel to the longitudinal axis 13 of symmetry of the stack, and adjacent to two opposing sides of, the square shaped in cross section, stack. Further, the conductor members 17 inter-connect the electrically conductive coatings 16 provided on the major substrate surfaces, the coatings and the conductor members, together, forming an extensive body. In the operation of the circuit, embodied within the electrical circuit assembly, the extensive body is to be maintained at zero potential. The arrangement of the extensive body is such that it reduces undesired electrical interaction between the constituent circuit elements within the electrical circuit assembly, which is advantageous, especially when the circuit comprises a linear circuit to operate at high frequencies.

The extensive body 16, 17 is connected to a point external of the electrical circuit assembly, and maintained at zero potential, in any known manner.

The conductor members 17 are also advantageous because they facilitate the electrical circuit assembly being handled, and reduce any propensity for the electrical circuit assembly to be damaged whilst being so handled.

Further, the conductor members 17 also may comprise heat conductors, serving to assist in conducting heat away from the circuit elements, where the heat is generated, and so obviating any damage to the electrical circuit assembly by such generated heat.

The conductor members 17 co-operate with the module substrates 12 in any convenient way. In the illustrated arrangement portions 18 of each conductor member are channel shaped in cross-section, the channel shaped portions extending in a plane at right angles to the longitudinal axis of symmetry of the stack. Each substrate is a press fit into a co-operating channel shaped portion provided by each conductor member, and possibly is soldered to each such conductor member. In particular, the arrangement is such that the conductor members interconnect the electrically conductive coatings provided on the substrates, at least partially, by the channel shaped portions of the conductor members engaging the coatings. Conveniently, each conductor member is formed from thin, initially-planar, sheet material, for example, the sheet material comprising copper, and each conductor member is formed by deforming the sheet material in the appropriate way, for example, by pressing.

Because each conductor member is formed from sheet material it is inherently flexible in character, and is advantageous in that it obviates any damage being caused by any differential thermal expansion between the constituent modules of the electrical circuit assembly.

Within the stack, each adjacent pair of substrates are separated by a uniform distance.

The conductor members 17 are also connected to layers 19 of conductive material provided adjacent to the peripheries of the substrates, and on the same major substrate surfaces as the circuit elements. Hence, the layers 19 are maintained at zero potential, and, conveniently, components 14 provided within the modules, and required to be connected to a point maintained at zero potential, are connected to such layers. Otherwise, such components are connected to the coatings 16 provided on the other major substrate surfaces, to the major substrate surfaces on which the components are mounted, by electrical connections indicated at 19'.

The illustrated electrical interconnections 20, provided between the constituent modules 11 of the stack 10, to complete a required circuit, each comprise a resilient, copper, U-shaped member, co-operating with only two adjacent modules 11 in the stack. For convenience, only one such electrical interconnection 20 is illustrated. The electrical interconnections 20 are secured to the modules 11 in any convenient way. The electrical interconnections are provided adjacent to the two opposing sides of the, square shaped in cross section, stack, extending parallel to the longitudinal axis 13 of symmetry of the stack, and not occupied by the two conductor members 17.

The module at one extremity of the stack is provided with terminals 22 for the electrical circuit assembly, each terminal being substantially of the same form as the U-shaped electrical inter-connections provided between the modules, but instead of being U-shaped, the terminals are provided with lugs 23 to co-operate with sockets provided by a member external of the electrical circuit assembly. Only one such terminal is illustrated.

Alternatively, in an unillustrated embodiment of an electrical circuit assembly, a module providing terminals may not have an electrically conductive coating on one major substrate surface thereof, but instead a conductor pattern is provided on the major substrate surface. The conductor pattern is connected to the circuit elements provided on the other major substrate surface, and provided within other modules of the stack, by U-shaped electrical interconnections at the periphery of the substrate. The terminals, of any convenient form, and provided in any convenient way, are integral with the conductor pattern. Hence, the terminals may be provided in any required form of two-dimensional array, over the whole of the major substrate surface bearing the conductor pattern. Consequently, the provision of a plurality of terminals for the electrical circuit assembly is facilitated.

For convenience, in further illustrated circuit assemblies, the conductors 15 on the substrates; and electrical interconnections between the modules, and in the form of U-shaped members 20; are not illustrated. Further, only some of the components 14, and, possibly, only some of the terminals of each electrical circuit assembly, are shown.

An electrical circuit assembly in accordance with the present invention may comprise a less complex electrical circuit assembly, terminals of the less complex electrical circuit assembly being connected to other constituent parts of a more complex electrical circuit assembly. The other parts of the more complex electrical circuit assembly each may have any required form, for example, and in accordance with the present invention, the less complex electrical circuit assembly is arranged to co-operate with a conventional printed circuit board, the longitudinal axis of symmetry 13 of the stack extending at right angles to the plane of the printed circuit board. The terminals 23 illustrated in FIG. 1, and comprising lugs, and provided by the less complex electrical circuit assembly, are inserted into co-operating socket terminals providing by the printed circuit board. Further, lugs 24 are formed on the conductor members 17, and are arranged to be inserted into co-operating sockets provided by the printed circuit board, and flanges 25 are formed on the conductor members, so that the less complex electrical circuit assembly is supported by the printed circuit board, and is connected electrically to the printed circuit board.

Such an arrangement, with two associated less complex electrical circuit assemblies, is shown partially in FIG. 2. The printed circuit board is indicated generally at 27. For convenience, the conductor members 17, the electrical inter-connections 20 between the modules, and the terminals 22 provided by each less complex electrical circuit assembly, are not shown in FIG. 2. Further, the terminals provided by the printed circuit board, and the electrical interconnections between such printed circuit board terminals and each less complex electrical circuit assembly, are not shown. Otherwise, parts of each electrical circuit assembly of FIG. 2 identical with, or closely resembling, parts of the electrical circuit assembly of FIG. 1, are identified by the same reference numerals in both Figures. The printed circuit board 27 comprises a common support for the stacks, with the longitudinal axes of symmetry 13 of the stacks extending parallel to each other, and at right angles to the plane of the printed circuit board. The constituent less complex electrical circuit assemblies may be interconnected in a required way by the printed circuit board. Otherwise, possibly, only the conductor members of each electrical circuit assembly are connected to the printed circuit board.

The printed circuit board 27 also provides an additional conductor member 28, extending between the two illustrated less complex electrical circuit assemblies 10. The additional conductor member 28 extends parallel to the longitudinal axes of symmetry 13 of the stacks, and at right angles to the general plane of the printed circuit board. The additional conductor member 28 is connected to, and is considered to be a part of, the extensive body 16, 17 within each associated electrical circuit assembly, and thus is maintained at zero potential. Hence, the additional conductor member 28 reduces undesired electrical interaction between the circuit elements of the different, associated less complex electrical circuit assemblies. Such an additional conductor member provided by the printed circuit board may have any required shape, and may extend between more than an adjacent pair of constituent less complex electrical circuit assemblies of the more complex electrical circuit assembly.

It is advantageous that, for the illustrated associated pair of electrical circuit assemblies 10, the signal path is generally from the printed circuit board 27, through one of the electrical circuit assemblies, to the module 11' remote from the printed circuit board of said one of the electrical circuit assemblies, and then to the module 11' remote from the printed circuit board of the other of the electrical circuit assemblies, and through said other of the electrical circuit assemblies, to return to the printed circuit board. Such a signal path is indicated by 29 in FIG. 2. The electrical connections between the two electrical circuit assemblies, remote from the printed circuit board, are indicated generally at 30. The terminals provided by the modules of the two electrical circuit assemblies remote from the printed circuit board are indicated generally at 31.

A modification of the more complex electrical circuit assembly of FIG. 2 is shown partially in FIG. 3. Parts of the two more complex electrical circuit assemblies identical with, or closely resembling, each other, are identified by the same reference numerals in both Figures. In the modification of FIG. 3, the adjacent pair of less complex electrical circuit assemblies 10 are arranged to share a common module 35, at the extremities of the stacks remote from the common support 27. The common module 35 is considered to be a constituent module 10 of each associated less complex electrical circuit assembly 10, and has a construction substantially identical with the other constituent modules 11. In particular, the common module 35 has a substrate 12' more extensive than, but extending parallel to, each other constituent substrate 12 of each associated less complex electrical circuit assembly. In FIG. 3, the circuit elements within the modules, for convenience, are not shown. However, one of the conductor members 17' is illustrated, this conductor member being shared by the two less complex electrical circuit assemblies. The additional conductor member 28 is connected to each shared conductor member 17' (not shown in FIG. 3); and/or is connected to the electrically conductive coating 16' provided within the common module 35. The arrangement may be such that an electrically conductive coating is not provided within the common module 35.

In the more complex electrical circuit assembly of FIG. 3, possibly only one conductor member 17' is shared by the constituent less complex electrical circuit assemblies.

In the more complex electrical circuit assembly of either FIG. 2, or FIG. 3, the additional conductor member 28 may be omitted.

A modified form of electrical circuit assembly 40 is shown in FIG. 4. Parts of the electrical circuit assembly of FIG. 4 identical with, or substantially resembling, parts of the electrical circuit assembly of FIG. 1, are identified by the same reference numerals in both Figures.

In the embodiment of FIG. 4, the conductor members 41, also comprising members partially holding the modules 11 in their required locations within the, square shaped in cross section, stack, comprise corner pieces extending parallel to the longitudinal axis of symmetry 13 of the stack. The conductor members 41 co-operate with the module substrates 12 in any convenient way, for example, the substrates being a press fit within co-operating pairs of flanges (not shown), of any convenient construction, and provided by each of the conductor members, each conductor member providing a co-operating pair of flanges for each substrate, at least one flange of each co-operating pair of flanges being electrically conductive. The substrate, possibly, also is soldered to the flanges.

The illustrated electrical interconnections 42, provided between the constituent modules 11 of the stack 10, to complete a circuit, each comprise a member partially holding the modules in their required locations within the stack, and extending parallel to the longitudinal axis of symmetry 13 of the stack. The end portions of such electrical interconnections may comprise terminals of the electrical circuit assembly. The electrical interconnections 42 are secured to the module substrates 12 in any convenient way, for example, being secured in aligned bores extending through the substrates, and possibly decoupled from the modules by discoidal capacitors; or, as shown, the electrical interconnections being secured in aligned notches 44 formed in the substrate peripheries; or each such electrical interconnection comprising flexible strip material, provided with pairs of resilient flanges, for example, by bending the strip, and to engage the module substrates. In any such arrangement, the electrical interconnections comprise part of the means securing the modules in the stack.

Again, lugs 46 are provided by the conductor members 41, so that the stack may be mounted on a support (not shown).

The provided conductor members 41 also may act as heat conductors.

Figure 5:
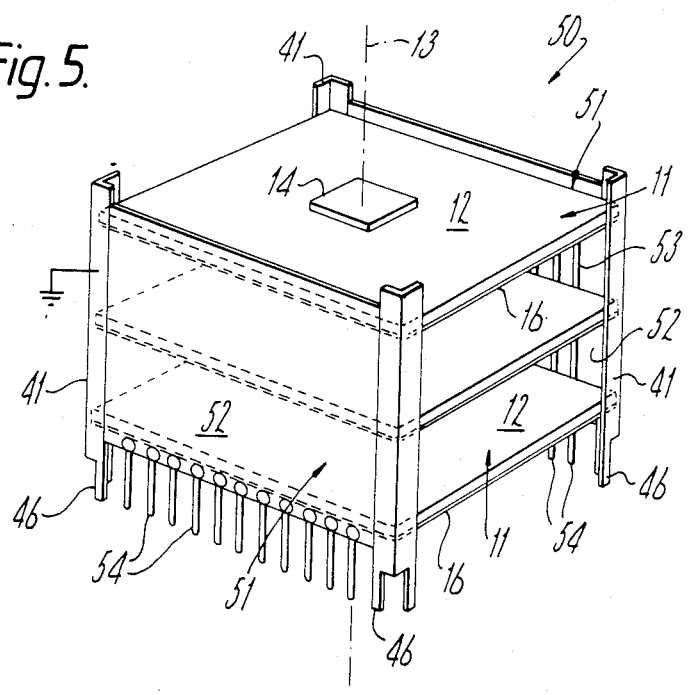

In the modification of the electrical circuit assembly of FIG. 4 shown at 50 in FIG. 5, parts of the electrical circuit assemblies identical with, or closely resembling, each other, are identified by the same reference numerals in both Figures.

The electrical circuit assembly 50 of FIG. 5 differs from that of FIG. 4 in that the electrical interconnections, provided between the constituent modules 11 of the stack, are provided as parts of generally planar members 51 partially holding the modules in their required locations within the, square shaped in cross section, stack. The planar parts 52 of the members 51 comprise electrically insulating supports for the electrical interconnections 53, the electrical interconnections comprising conductors formed on the electrically insulating planar parts 52. The module substrates 12 co-operate with the members 51 in any convenient way, for example, being a press fit within co-operating pairs of flanges (not shown), and, possibly, also being soldered to such flanges, each member providing a co-operating pair of flanges for each substrate.

Terminals for the electrical circuit assembly 50 comprise lugs 54 mounted on the electrically insulating, planar parts 52 of the members 51. The lugs 54 are connected directly to the electrical interconnections 53.

The planar members 51 assist in enabling the electrical circuit assembly to be handled without damage.

Circuit elements may be mounted on the planar parts 52.

The flanges may be provided on the conductor members in any convenient way; and if flanges of non-electrically conductive material are included, they may be provided in a different manner compared with the provision of the electrically conductive flanges. If some of the members, at least partially, holding the modules in their required locations in the stack, do not comprise electrical interconnections provided between the modules, and do not comprise conductor members, such co-operating pairs of flanges, of any convenient form, are required to be provided on such other members.

The members, at least partially, holding the modules in their required locations within the stack, may have any convenient shape. Such members, including electrical inter-connections provided between the modules and comprising such members, are advantageous, the members being capable of holding the modules during the assembly of the stack. It may be desirable that faulty modules are readily replaceable, and, in particular, that the modules are resiliently held by the members. Further, electrical interconnections, provided between the modules, and not comprising members, at least partially, holding the modules in their required locations within the stack, desirably are resiliently secured to the modules.

Otherwise the modules may be rigidly secured within the stack by the members, and by the electrical interconnections. For example, the members, and the electrical interconnections, may be of tinned copper, and are soldered to the module substrates in the completed electrical circuit assembly.

Usually, additional securing means, of any known form, is provided for the stack.

Each conductor member may comprise an electrically conductive layer on an electrically insulating support therefor.

Possibly, of the plurality of members, at least partially, holding the modules in their required locations in the stack, except any electrical interconnections provided between the modules and comprising such members, each comprises a conductor member, arranged to interconnect the electrically conductive coatings. If only some of the members, not comprising electrical interconnections, comprise conductor members, the, or each, conductor member, possibly, has substantially the same shape as, and, possibly, co-operates with the module substrates in the same way as, other such members.

In addition, at least one conductor member may be provided within an electrical circuit assembly in accordance with the present invention, such a conductor member, whilst having any one of the different possible forms indicated above, does not co-operate with electrically conductive coatings on the module substrates, and so does not form part of a extensive body, maintained at zero potential, within the electrical circuit assembly. Instead, such a conductor member comprises part of an electrical path, whereby a power supply is connected to each constituent module of the electrical circuit assembly.

The module substrates may not be wholly planar in form, but extend generally in a plane.

The module substrates may be rectangular shaped in plan, or have any other convenient shape.

There may be minor variations in the constructions of the constituent modules of an electrical circuit assembly in accordance with the present invention.

An electrically conductive coating may not be provided within each constituent module of an electrical circuit assembly. Circuit elements may be mounted on both major substrate surfaces of such modules.

A casing may be provided for an electrical circuit assembly in accordance with the present invention, to prevent any undesirable electrical interaction between the electrical circuit assembly, and elements external of the electrical circuit assembly.

What I claim is:

1. In combination, a pair of electrical circuit assemblies; a support upon which the electrical circuit assemblies are mounted, each electrical circuit assembly comprising a stack of a plurality of substantially identically constructed modules, each such module comprising a substantially planar electrically insulating substrate extending at right angles to a longitudinal axis of symmetry of the stack, each module having circuit elements on only one major substrate surface thereof and being provided with a layer of electrically conductive material wholly coating an opposite major substrate surface, means for electrically interconnecting the modules to form a completed electrical circuit, the modules, at least partially, being held in required locations in the stack by a plurality of members extending parallel to the longitudinal axis of symmetry of and at least wholly along the stack, at least one of said members being an electrical conductor member which interconnects the electrically conductive coatings of the modules, the electrically conductive coatings of said modules and the electrical conductor member connected thereto together forming an extensive body which is maintained at zero potential so as to reduce undesired electrical interaction between the circuit elements of said modules; the pair of electrical circuit assemblies being mounted on the support adjacent to one another by the plurality of members co-operating with the support, the support extending generally in a plane at right angles to the longitudinal axis of symmetry of each stack; and a common module disposed at an extremity of the pair of electrical circuit assemblies, the common module having a substrate which extends parallel to the substrates of the pair of electrical circuit assemblies and which is sized such that a portion of the common module extends over and constitutes part of each stack of modules.

2. A combination as claimed in claim 1 in which portions of the conductor member are channel shaped in cross section, the channel shaped portions extending in a plane at right angles to the longitudinal axis of symmetry of the stack, with each module being press fitted into a co-operating channel shaped portion provided by the conductor member.

3. A combination as claimed in claim 1 in which the modules are held resiliently within the stack by the members.

4. A combinatioin as claimed in claim 3 in which the conductor member is formed by deforming initially-planar sheet material.

5. A combination as claimed in claim 1 in which, each of the plurality of members, including the conductor member, comprises a corner piece for the stack.

6. A combination as claimed in claim 1 in which each of the plurality of members, including the conductor member, is at least substantially planar in form.

7. A combination as claimed in claim 1 in which there is provided an additional conductor member which extends parallel to the longitudinal axes of symmetry of the stacks and is disposed between the electrical circuit assemblies, and the additional conductor member is connected to the extensive body within each electrical circuit assembly so as to be maintained at zero potential.

8. A combination as claimed in claim 1 in which there is provided an additional conductor member, connected to the pair of electrical circuit assemblies, the additional conductor member extending parallel to the longitudinal axes of symmetry of the stacks and being disposed between the pair of electrical circuit assemblies, and the additional conductor member is connected to an electrically conductive coating wholly covering a major substrate surface of the common module and is connected to the extensive body.

9. A combination as claimed in claim 1, wherein the plurality of members comprise a pair of planar members disposed at opposing sides of the stacks of modules, the planar members having a dimension parallel to the axis of symmetry of the stacks which is greater than the height of the stacks of modules and having a transverse dimension at least equal to the dimension of an adjacent side of the common module, the planar members being formed with channel portions receiving and resiliently holding the modules and providing electrical connection to the conductive coatings of the modules.

10. A combination as claimed in claim 9, wherein said electrical interconnecting means extends between modules of the stack adjacent to sides other than said opposing sides.

* * * * *